United States Patent [19]

Geigel et al.

[11] Patent Number: 5,590,121
[45] Date of Patent: Dec. 31, 1996

[54] METHOD AND APPARATUS FOR ADAPTIVE FILTERING

[75] Inventors: Alfred A. Geigel, Dunellen; William E. Keasler, Tinton Falls, both of N.J.

[73] Assignee: Lucent Technologies Inc., Murray Hill, N.J.

[21] Appl. No.: 413,643

[22] Filed: Mar. 30, 1995

[51] Int. Cl.⁶ ................................................. G06F 17/10
[52] U.S. Cl. .................... 370/290; 375/232; 364/724.19
[58] Field of Search ........................... 364/724.19, 724.2; 370/32.1; 375/232

[56] References Cited

U.S. PATENT DOCUMENTS

| | | | |
|---|---|---|---|
| 4,771,396 | 9/1988 | South et al. | 364/724.16 |
| 5,216,629 | 6/1993 | Gurcan et al. | 364/724.19 |
| 5,455,819 | 10/1995 | Sugiyama | 370/13 |

FOREIGN PATENT DOCUMENTS

| | | | |
|---|---|---|---|
| 4-328911 | 4/1993 | Japan | H03H 15/00 |
| 5-333870 | 3/1994 | Japan | G10K 11/16 |

OTHER PUBLICATIONS

Messerschmitt, D. G., "Echo Cancellation in Speech and Data Transmission," IEEE Journal on Selected Areas in Communications, vol. SAC-2, No. 2, Mar. 1984, pp. 283–296.

Treichler, J. R., et al., *Theory and Design of Adaptive Filters*, "Digital Voice Echo Canceller with a TMS32020," by Texas Instruments and Teknekron Communications System, John Wiley & Sons, New York, pp. 302–323.

M. A. Soderstrand et al., "Experimental Performance Data for Slowed–Down Adaptive Algorithms", Int. J. Electronics, vol. 53, No. 1, pp. 95–99 1982.

*Primary Examiner*—Douglas W. Olms
*Assistant Examiner*—Matthew C. Phillips

[57] ABSTRACT

A finite impulse response (FIR) filter characterization is performed using a modified least means squares approach that updates values of FIR filter taps as groups of taps, periodically. For the taps updated for a current input signal sample, future convolution values for future input signal samples are computed and also a partial estimate of the signal response is computed. The expected response is then computed by summing the partial estimate signal response and other partial estimates of the signal response which are computed from future convolution, missed tap update convolution and normalizes error signal values which have been previously computed at past input signal samples and stored in memory.

24 Claims, 8 Drawing Sheets

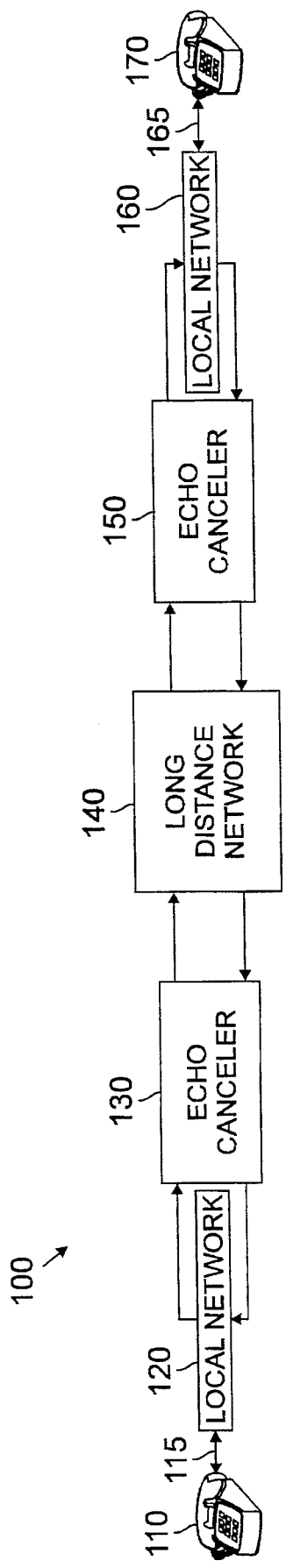
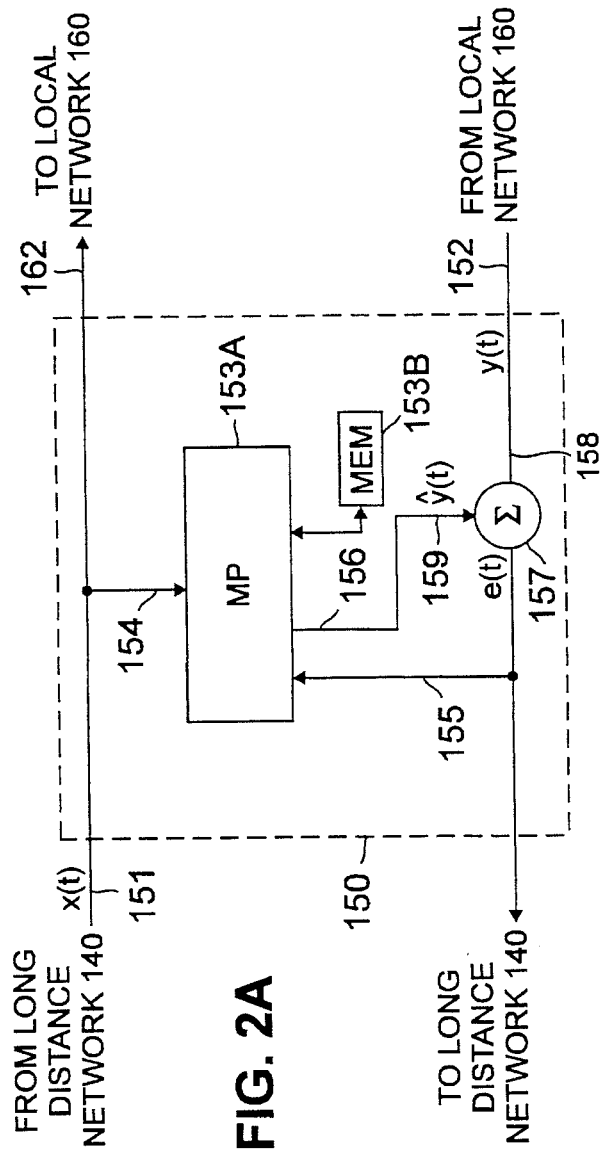
FIG. 1
FIG. 2A

METHOD AND APPARATUS FOR ADAPTIVE FILTERING

FIELD OF THE INVENTION

The present invention relates generally to the field of digital signal processing, and in particular, to adaptive finite impulse response filters.

BACKGROUND OF THE INVENTION

Adaptive finite impulse response (FIR) filters are used in digital signal processing systems such as, for example, network communication and medical instrumentation systems, to characterize the signal response in those systems. For example, a line echo canceler containing an adaptive FIR filter is typically included in a telecommunication network for purposes of eliminating undesirable echo that occurs in a subscriber loop signal path of a point-to-point telecommunication network channel. Line echo, if left unmitigated, causes a telephone caller to receive a delayed, audible echo of his or her own speech along with any speech signal that the calling party at the other end of the channel transmits.

An adaptive FIR filter typically is implemented using digital circuitry which suitably comprises a memory for storing data, and a programmed microprocessor or microcontroller for performing arithmetic operations associated with computing the signal response of a signal path. Typically, well known least mean squares (LMS) FIR techniques are utilized for computing an estimate of the signal response. For example, an adaptive FIR filter implemented in an echo canceler of a communication network typically calculates a digital output response signal, $\hat{y}(t)$, which is an estimate of a response echo signal, $y(t)$, which would be produced from an input speech signal, $x(t)$, provided in a channel of the network, according to the following LMS estimate equation:

$$\hat{y}(t) = \sum_{n=0}^{N-1} h_n(t) \cdot x[t-n], \qquad [1]$$

where $h_n(t)$ is an estimate of an expected relationship between the response echo signal $y(t)$ and the input signal $x(t)$, n represents the nth FIR filter coefficient or tap for a time t and N is equal to total number of taps. The adaptive FIR filter further calculates updated values for each of the taps of $h_n(t)$ for every input signal sample $x[t]$ received on a channel serviced by the echo canceler, according to the LMS update equations:

$$h_n(t+1) = h_n(t) + Ae(t) \cdot x[t-n], \text{ for } 0 \leq n \leq N-1, \text{ and} \qquad [2a]$$

$$e(t) = y(t) - \hat{y}(t), \qquad [2b]$$

where A is a gain scaling factor less then 1.

The above-described LMS-based adaptive FIR filter implementation requires that, for every input signal sample $x[t]$ provided, the microprocessor must read from the memory N tap values $h_n(t)$ and the values of the previous N−1 input signal samples $x[t-n]$, and must write to the memory N updated tap values $h_n(t+1)$ and the current input signal sample value $x(t)$, in other words, perform 3N memory accesses per signal sample.

The number of memory accesses required for each input signal sample provided to the FIR limits the capacity of the microprocessor, and in turn that of the FIR filter. For example, the FIR filter in an echo canceler may not be able to characterize concurrently the signal response of many signal paths or signal paths having long path lengths. The capacity of such an adaptive FIR filter is measured by the product of the number of taps, N, in the filter and the number of channels that are serviced by the filter. For example, an adaptive FIR filter which is used in an echo canceler for servicing 32 channels of 64 msec echo paths, where the sampling frequency is 8 KHz, consists of 512 taps per channel, and would require a memory access rate in excess of 392 MHz.

Clearly, the required number of memory accesses per second for an adaptive FIR filter cannot exceed the maximum clock rate of the FIR filter implementation. Currently, CMOS technology provides that microprocessors may read data from and write data to memory at clock rates of approximately 80–100 MHz. Thus, for the example of echo canceler operation described above, the requirements concerning the number of channels or the echo path delay serviced would have to be modified accordingly. Although technologies achieving faster clock speeds may be developed, the capacity of an adaptive FIR filter still remains limited by the number of memory accesses that must be performed to characterize the impulse response for a particular input signal sample.

SUMMARY OF THE INVENTION

The present invention provides methods and apparatus for computing an accurate estimate of the signal response of a system by performing a reduced number of memory accesses for each input signal sample to the system. A microprocessor implementation of an adaptive FIR filter operating at a given clock speed, therefore, may concurrently compute estimate response signals for many systems and for systems which require many FIR taps for purposes of characterizing the response.

In one embodiment of the present invention, an FIR filter having N taps equally partitions the taps into M subset blocks each comprising N/M taps. The values of taps in these subset blocks are updated every M input signal samples by use of a modified version of the LMS update equation, such that each FIR tap is periodically updated. Only a fraction of the FIR tap values, therefore, are retrieved from and written to a memory for each input signal sample, and only a fraction of the previous sample values of the input signal are retrieved from the memory for each input signal sample. For a current input signal sample of interest, convolutions of past input signal sample values with the tap values of the currently updated subset block are computed and then stored in the memory as future convolution values. In addition, missed tap update convolutions of past input sample signal values are computed and then stored to compensate for inaccuracies in the values of taps which may result from not continuously updating all the FIR taps for each input signal sample. The estimated response signal for the current input signal sample is then generated from a summation of (i) convolution of the past input signal sample values with the tap values for the currently updated subset block, and (ii) the stored values of future convolutions corresponding to the current input signal sample as modified by the missed tap update convolutions and normalized error signal values which were previously calculated and stored for the current input signal sample. Computation of an error signal value based on the difference of the echo signal and the estimate echo signal which may be utilized for improving the accuracy of estimating a response signal value is delayed for M−1 input signal samples.

In an alternative embodiment, taps of an adaptive FIR filter implementation are grouped into a first subset block comprising the first M taps and into M secondary subset blocks. Each of the secondary subset blocks include (N-M)/M of the remaining N-M taps. The taps of the first subset block are updated at every input signal sample using ordinary LMS techniques. The taps of the M secondary subset blocks are updated every Mth input signal, using the modified LMS update equation, such that each tap of a secondary subset block is periodically updated. Future convolution and missed tap update convolution values are computed and stored as in the above embodiment. The estimated response signal for the current input signal sample is then generated from a summation of (i) convolutions of past input signal values with the first M taps, (ii) convolution of the past input signal sample values with the tap values for the currently updated subset block, and (iii) the stored values of future convolutions corresponding to the current input signal sample which are adjusted by the missed tap update convolutions and the normalized error signal values which were computed for the current input signal sample, as above. The difference between actual signal response and the estimated signal response is computed without any delay to yield an error signal value, which may be utilized for improving the accuracy of estimating a response signal value.

Additional features and advantages of the present invention will become readily apparent to those of ordinary skill in the art by reference to the following detailed description and accompanying drawings.

BRIEF DESCRIPTION OF THE DRAWINGS

FIG. 1 illustrates a point-to-point telecommunication circuit which includes an implementation of an adaptive FIR filter in an echo canceler operating according to the present invention.

FIG. 2A illustrates an exemplary block diagram of an echo canceler including an adaptive FIR filter which may be utilized in the telecommunication circuit illustrated in FIG. 1 according to the present invention.

DETAILED DESCRIPTION

Figure 2B:
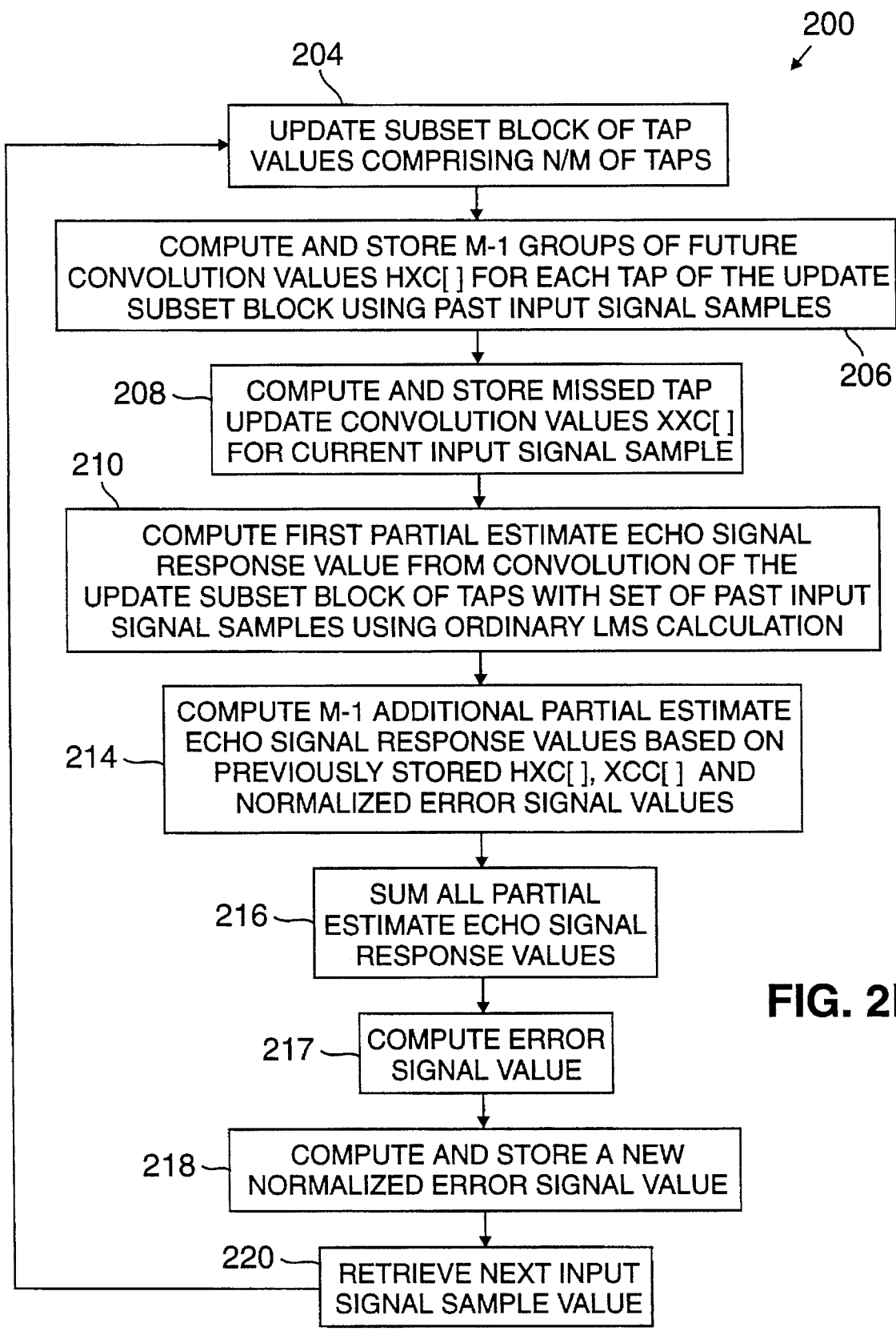
FIG. 2B illustrates a functional flow diagram of the operations performed by the adaptive FIR filter of FIGS. 1 and 2A in accordance with the present invention.

An adaptive FIR filter operating according to the present invention characterizes the response of a system, and computes an estimate of a response signal for an input signal provided to that system. For purposes of illustration, the present invention is described with respect to an adaptive FIR filter which may be suitably included in an echo canceler which is part of a telecommunication network to provide for cancelling echo signals that appear on point-to-point telecommunication channel signal paths. It is to be understood, however, that the concepts of the present invention which are described below may be similarly applied for implementing an adaptive FIR filter in other systems to perform similar operations.

FIG. 1 shows a typical point-to-point telecommunication circuit 100 including suitable components and signal paths which may be associated with a point-to-point communication or telephone call between two parties. The circuit 100 includes first and second telephone units 110 and 170, first and second local exchange networks 120 and 160, first and second echo cancelers 130 and 150 and a long distance network 140.

The first telephone unit 110 is typically connected to the first local network 120 by a subscriber loop connection or first two-wire line 115. Similarly, the second telephone unit 170 is connected to the second local network 160 through a second two-wire line 165. The first local network 120 is connected to the long distance network 140 through the echo canceler 130, and the second local network 160 is similarly connected to the long distance network 140 through the echo canceler 150. The connections between the first local network 120 and the echo canceler 130 and the second local network 160 and the echo canceler 150 are commonly known as four wire trunks which provide for transmission of a plurality of multiplexed signals.

Preferably, the first and second telephone units 110 and 170 are conventional components, and the first and second local networks 120 and 160 and the long distance network 140 are well known telecommunication circuits. Further, the first and second two-wire lines 115 and 165, and the trunks interconnecting the networks in the circuit 100 are suitably standard components.

As shown in the circuit 100, echo cancelers are typically located at each end of a long distance exchange network. It is to be understood, however, that an echo canceler implemented according to the inventive technique may be included in other network components, such as local or long distance networks, and may provide for echo signal cancellation in other network configurations. For purposes of illustration, first and second parties are located at the first and second telephone units 110 and 170, respectively, and speech signals provided at a telephone unit are digitized as input signal samples for transmission in the circuit 100 using conventional technique.

A point-to-point communication between the first party and the second party in the circuit 100 occurs as follows. An input signal sample travels from the first party at the first telephone unit 110 via the two-wire line 115 to the local network 120, and then is routed in multiplexed form to the long distance network 140 via the echo canceler 130. The long distance network 140 then routes the input signal to the second local network 160 via the echo canceler 150. The second local network 160 demultiplexes the input signal sample for routing to the second telephone unit 170 via the two-wire line 165. Similarly, an input signal sample from the second party at the second telephone unit 170 travels through the components of the circuit 100 in the reverse order to arrive at the first telephone unit 110.

Echo signals are generated within the circuit 100 as a byproduct of transmission of input signal samples between the first and second telephone units 110 and 170, respectively. For the most part, echo signals are generated in the circuit 100 between each destination telephone unit and its respective local network. For example, an echo signal is generated between the local network 160 and the telephone unit 170 from an input signal which is transmitted from the first telephone unit 110 to the second telephone unit 170. The echo signal comprises a delayed, reduced magnitude, and possibly distorted, replica of the input signal which is coupled back towards the second local network 160 during transmission over the second two-wire line 165. If left unmitigated, the echo signal will travel back to the first telephone unit 110 and cause the first caller to hear an undesired audible echo of the input signal, his speech, along with any speech signals which may have been provided by the second caller.

In accordance with the present inventive technique, an adaptive FIR filter implementation of the echo canceler 150 substantially cancels an echo signal associated with an input signal of speech provided at the telephone unit 110 using methods described in connection with FIGS. 2B, 3, 4, 5 and 6 below. The echo canceler 150, however, permits speech signals provided from the second calling party at the telephone unit 170 to propagate to the telephone unit 110 substantially unchanged. For purposes of illustration, the present invention is described with respect to the operation of the echo canceler 150. It is to be understood, however, that the echo canceler 130 may be operated similarly to cancel echo signals before they arrive at the telephone unit 170. The control and other non-linear functions of the echo canceler 150 are not included in this discussion, as they are well known in the art and not a part of the present invention.

FIG. 2A illustrates an exemplary embodiment of the echo canceler 150 as individual functional blocks which include a standard digital signal processor 153A, a standard memory 153B and a standard dual input adder 157. The functions these blocks represent may be provided for through the use of either shared or dedicated hardware, including but not limited to hardware capable of executing software. It is to be understood that the echo canceler 130 is similar, and preferably identical, to the echo canceler 150 in structure and operation, and that the memory 153B may be completely or partially external to the echo canceler 150.

For purposes of illustration, the echo canceler 150 suitably operates on digitized samples of speech signals. It is to be understood, however, that the echo canceler 150 may be readily utilized with analog speech signals by incorporating analog-to-digital converters according to known techniques.

In the echo canceler 150, a speech signal input 151 is connected to an input 154 of the processor 153A, and provides a connection through the echo canceler 150 between the long distance network 140 and the second local network 160. An echo signal input 152 connects the trunk from the second local network 160 to a first input 158 of the adder 157. A second subtracting input 159 of the adder 157 is connected to an output 156 of the processor 153A, and the output of the adder 157 is connected to the long distance network 140 as well as to a second input 155 of the processor 153A. It is to be noted that the echo signal input 152 also serves as part of the speech signal path between the second party at the second telephone unit 170 and the first party at the first telephone unit 110.

Echo cancellation operation for the telephone unit 110 by the echo canceler 150 occurs as follows. A digitized input signal sample, x[t], of a speech signal provided from the telephone unit 110 at the input 151 is routed to the input 154 of the processor 153A. Under normal circumstances, the input signal sample x(t) also propagates through the echo canceler 150 to the second local network 160 and on to the second telephone unit 170. At the second two-wire line 165, a delayed, reduced magnitude and possibly distorted, replica of x(t), hereinafter referred to as an echo signal y(t), is coupled back for transmission towards the echo signal input 152 of the echo canceler 150.

The time delay between the time that the signal x(t) leaves the echo canceler 150 at the output 162 and the time that the echo signal y(t) arrives back at the echo canceler 150 at the input 152 is called the echo path delay. In accordance with the present invention, the processor 153A simulates the adaptive FIR filter impulse response characteristics of the echo path using LMS techniques, wherein the FIR filter is represented as having a time-varying impulse response, H(t), which includes a series of N taps, $h_n(t)$, where n=0 to N−1, and N is proportional to the maximum echo path delay and equal to the number of taps required for the filter to adequately cancel the echo. As described below in connection with FIG. 2B, the processor 153A of the echo canceler 150 provides at the output 156 an estimate echo signal $\hat{y}(t)$ at the time that the echo signal y(t) propagates through the input 152 to the adder 157. The adder 157 then subtracts $\hat{y}(t)$ from y(t) to produce an error signal, e(t), at the output 157. If the impulse response tap values $h_n(t)$ accurately characterize the echo path, then the error signal e(t) will be greatly attenuated if not substantially eliminated, in other words, the echo signal y(t) produced from the input signal x(t) will be substantially cancelled and not received by the first caller at the telephone unit 110. The processor 153A utilizes the values of the error signal e(t) to update the values of the FIR filter taps, and cause the estimates of echo path impulse response to converge to the actual echo impulse response. It is to be understood that the echo canceler 150 suitably operates to permit input signals which originate at the telephone unit 170 to pass through the adder 157, as these input signals are not included $\hat{y}(t)$.

FIG. 2B shows a functional flow diagram 200 of the operations that the processor 153A may perform to implement the echo canceler 150 as an FIR filter which approximates the echo path response of a point-to-point communication channel. FIGS. 3, 4, 5 and 6 illustrate in detail the operations represented generally in the flow diagram 200. As explained in further detail below, the present invention provides the advantage that a reduced number of memory reads and writes, or memory accesses, are performed per input signal sample received on a channel by the echo canceler 150 to characterize the signal path and compute the estimated response signal for an input signal sample, thereby increasing the capacity of hardware presently used for implementing an echo canceler.

Referring to FIG. 2B, in step 204, the processor 153A divides the taps of H(t) into M groups of subset blocks which comprise N/M taps each, where M is suitably an integer divisor of N, typically between 2 and 10, and preferably equal to 3 or 4. Each subset block of taps is updated every M samples according to a slight variation of the LMS update equations [2a] and [2b], hereinafter referred to as the modified LMS update equation. For example, a first subset block is updated for input signal samples x[t], x[t+M], x[t+2M], and so forth, while a second subset block is updated for input signal samples x[t+1], x[t+M+1], x[t+2M+1], and so forth. The group of taps of H(t) which is updated for a current input signal sample is called the update subset block. The modified LMS update equation, described in further detail below in connection with FIG. 3, updates the values of the taps in the update subset block using the M previous values of the normalized error signal ae(t) in order to compensate for the missed updates of this block of taps during the previous M−1 samples.

Thereafter, in step 206, the processor 153A computes a series of M−1 groups of convolutions, hereinafter called future hxc[ ] convolutions and described in further detail below in connection with FIG. 4, of the update subset block with M−1 groups of past sample values of input signal x(t), which were received at the input 151. For example, if x[5] is the current input signal sample x[t], an input signal sample received in the past may be x[4], x[3], x[2] and so forth. The processor 153A stores in the memory 153B the values of the M−1 future hxc[ ] convolutions for each input signal sample. The stored future hxc[ ] convolutions are used for calculating the estimated filter response, ŷ(t), or estimated echo signal response in the exemplary embodiment, for input signal samples received subsequent to the current input signal sample, or future input signal samples, as described below in connection with FIG. 6. The calculation of future hxc[ ] convolutions for the current input signal sample is advantageous in that the taps of the current update subset block are not retrieved from the memory 153B during the following M−1 samples. In other words, the hxc[ ] convolutions computed at the current input signal sample compensate for the convolutions of this block of taps which are not computed for the next M−1 samples. A more detailed description of the reduced memory access feature of the present invention is described below.

In step 208, the processor 153A computes M(M−1)/2 groups of convolutions, hereinafter called missed tap update future xxc[ ] convolutions and described in further detail in connection with FIG. 5, using the same set of past x(t) samples that were used in step 206 to compute the hxc[ ] convolutions. The processor 153A stores in the memory 153B the values of the M(M−1)/2 future xxc[ ] convolutions for each input signal sample. The stored future xxc[ ] convolutions are used in the calculation of the estimate echo signal ŷ(t) for a future input signal sample to compensate for the contributions of the taps which were not updated at the current input signal sample, or missed tap updates, as discussed in detail below in connection with FIG. 6.

In step 210, the processor 153A commences calculation of the estimate echo signal ŷ(t) for the current input signal sample. A first partial estimate echo signal value is generated, in accordance with the conventional LMS method and described with reference to FIG. 6, from the convolution of the same set of past input signal samples x[t] that were used in step 206 with the update subset block taps. Then, in step 214, the processor 153A generates M−1 additional partial estimate echo signal response values from the stored future hxc[ ] convolution values which correspond to the current input signal sample. As explained in connection with FIG. 6, the values of these partial estimate responses are accordingly adjusted using the currently stored xcc[ ] missed update convolutions and past values of the normalized error signal.

In step 216, the processor 153A sums the first and the additional partial estimate echo signal values to obtain the echo estimate signal response ŷ(t). Thereafter, in step 217, the adder 157 determines the error signal e(t) by finding the difference between y(t) and ŷ(t). Then in step 218, the processor 153A stores in the memory 153B a normalized version of the error signal e(t) which was obtained in step 217. In step 220, the processor 153A receives the next input signal sample and proceeds from step 204 to repeat the execution of the operation of the flow diagram 200.

Figure 3:
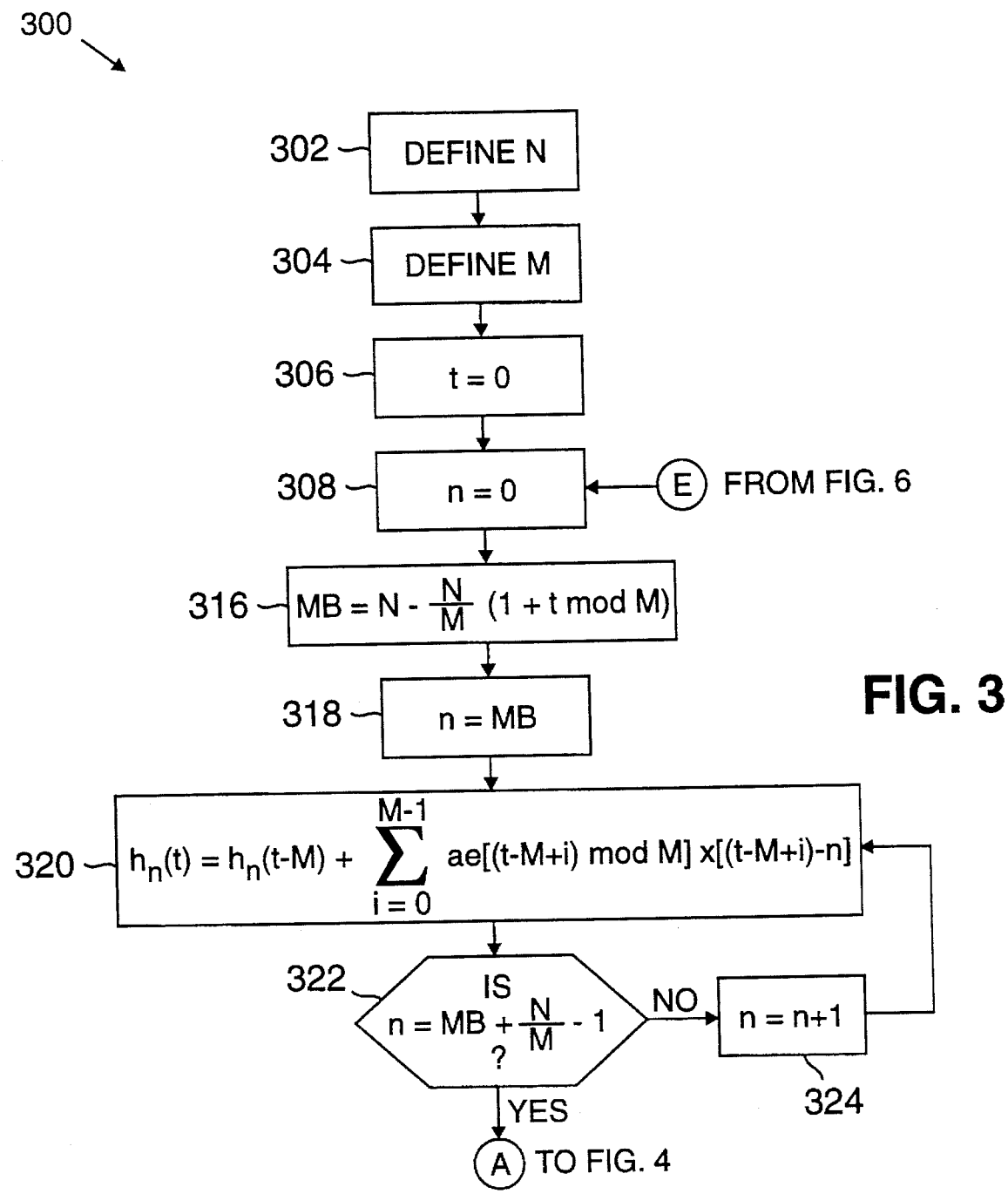
FIGS. 3, 4, 5 and 6 illustrate detailed functional flow diagrams of methods for performing the operations of the adaptive FIR filter described in FIG. 2B.

FIG. 3 shows steps of a process 300 that the processor 153A of the echo canceler 150 may suitably perform to execute step 204 of the flow diagram 200.

In the first three steps 302, 304 and 306, the processor 153A initializes various parameters, which may be suitably stored in the memory 153B and are required for implementing the method of the present invention. In step 302, a value N, which defines the number of coefficients or taps in the FIR filter transfer function H(t) representation of the echo path, is initialized. The value assigned to N is based upon the input signal sample rate and the maximum length of an echo path that the FIR filter implementation of the echo canceler 150 must be able to service. For example, an FIR filter which is designed to service up to 64 ms of echo path for speech signals provided at 8000 input signal samples/sec requires (8000)(0.064) or 512 taps.

In step 304, a value, M, is initialized for determining the number of FIR taps that are to be processed for each input signal sample. As explained in further detail below, N/M taps are updated each sample, and accordingly, every tap is updated at least once every M samples. Then, in step 306, a time index, t, of the input signal sample x(t) is set equal to 0.

Step 308 is the first step of a sequence of steps which is executed for every input signal sample. It is noted that for t=0, in other words, the first input signal sample, the operations described in many of the ensuing steps will have little significance because they involve values of variables from previous input signal samples, i.e., x[t−1], x[t−2], etc. To this end, it should be noted that if a step involves a value from a previous input signal sample, and the previous input signal sample does not exist, that value should be considered as equal to 0. In any event, discussion of the process 300 is more clearly understood under the assumption that at least N+M input signal samples have already been received and stored in the memory 153B by the processor 153A, or, in other words, t>N+M. In step 308, the processor 153A provides that a counter or index n, which is a tap index, is set equal to 0. This counter, and other counters described below, may be a location in the memory 153B, or, alternatively, any well-known discrete device.

Steps 316 through 324 concern the operations described for step 204 of the flow diagram 200. In these steps, the processor 153A updates the values of the update subset block of N/M FIR taps using a slight variation or modified version of the LMS update equation.

In particular, in step 316, the processor 153A computes a block start value, MB, from the equation:

$$MB = N - \frac{N}{M}(1 + t \bmod M), \qquad [5]$$

where (t mod M) is the modulus or remainder value of an integer division of t/M and the value of (t mod M) is suitably between (M−1) and 0. The value of MB represents the index of the first tap of the update subset block for a current input signal sample. The value of MB changes for every input signal sample because the group of taps included in an update subset block change accordingly for every input signal sample. For example, in a 512 tap filter with M=4, MB may be equal to 0, 128, 256 or 384. In step 318, the tap index n is set equal to the value MB.

Thereafter, in step 320, the nth tap of H(t) is updated according to the modified LMS update equation:

$$h_n(t) = h_n(t-M) + \sum_{i=0}^{M-1} ae[(t-M+i) \bmod M] \cdot x[(t-M+i) - n] \qquad [6]$$

In essence, the new tap weight, $h_n(t)$, is equal to the sum of (i) the most recently updated value of the tap, $h_n(t-M)$, which was updated M input signal samples earlier, and (ii) the sum of M products of the normalized error signal values for the previous M input signal samples multiplied by the values of M previous input signal samples, x[(t−M+i)−n]. Once $h_n(t)$ is determined, then in step 322, the processor 153A determines whether all of the taps in the update subset block have been updated. If not, then in step 324, the value of n is incremented and step 320 is executed. Otherwise, the tap updates are complete, and processing continues as shown in FIG. 4.

Figure 4:
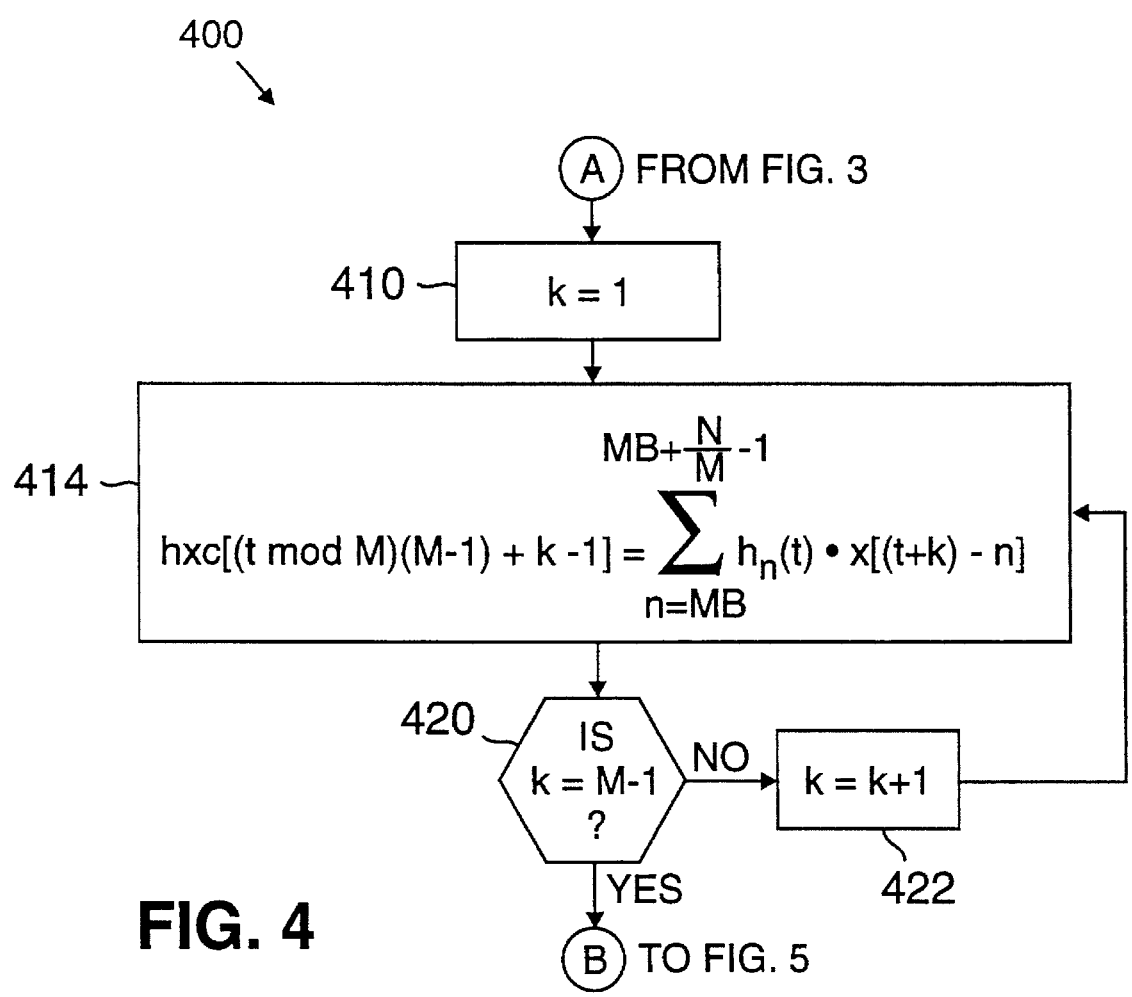

FIG. 4 illustrates, in detail, the steps of a process 400 that the processor 153A must perform to execute step 206 of the process 200, in other words, calculate future hxc[ ] convolutions using the values of the taps in the update subset block. In the prior art LMS technique, a convolution of H(t) with the input signal samples involves every FIR tap at every input signal sample in order to achieve an estimate of the echo signal ŷ(t). The method of the present invention provides the advantage that the processor 153A need not retrieve from the memory 153B every tap value at every input signal sample for the purpose of calculating ŷ(t). Instead, as explained in connection with the process 400, a set of M−1 future hxc[ ] convolutions of the taps in the update subset block with the same group of past sample values of the input signal x(t) that was retrieved from the memory 153B in step 320 is computed and stored in the memory 153B for subsequently determining values of ŷ(t) for future input signal samples.

Referring to FIG. 4, in step 410, the processor 153A initializes a counter k to the value of 1. The value stored in the counter k represents an index of the future input signal sample for which a future hxc[ ] convolution is performed. Then, in step 414, the processor 153A computes the future hxc[ ] convolutions of the tap values updated in the update subset block with a group of past sample values of the input signal x(t) that was retrieved from the memory 153B in step 320 according to the following relationship:

$$hxc[(t \bmod M)(M-1) + k - 1] = \sum_{n=MB}^{MB + \frac{N}{M} - 1} h_n(t) \cdot x[(t+k) - n] \quad [7]$$

The processor 153A stores the values of the future hx convolution hxc[ ] in the memory 153B as the variables hxc[p], where p is equal to (t mod M (M−1)+K−1), for use in subsequently determining an estimate echo signal.

If, in step 420, the processor 153A determines that M−1 future hxc[ ] convolutions have not been computed, then in step 422, the counter k is incremented and step 414 is executed. Otherwise, processing continues in the manner described in connection with FIG. 5.

Figure 5:
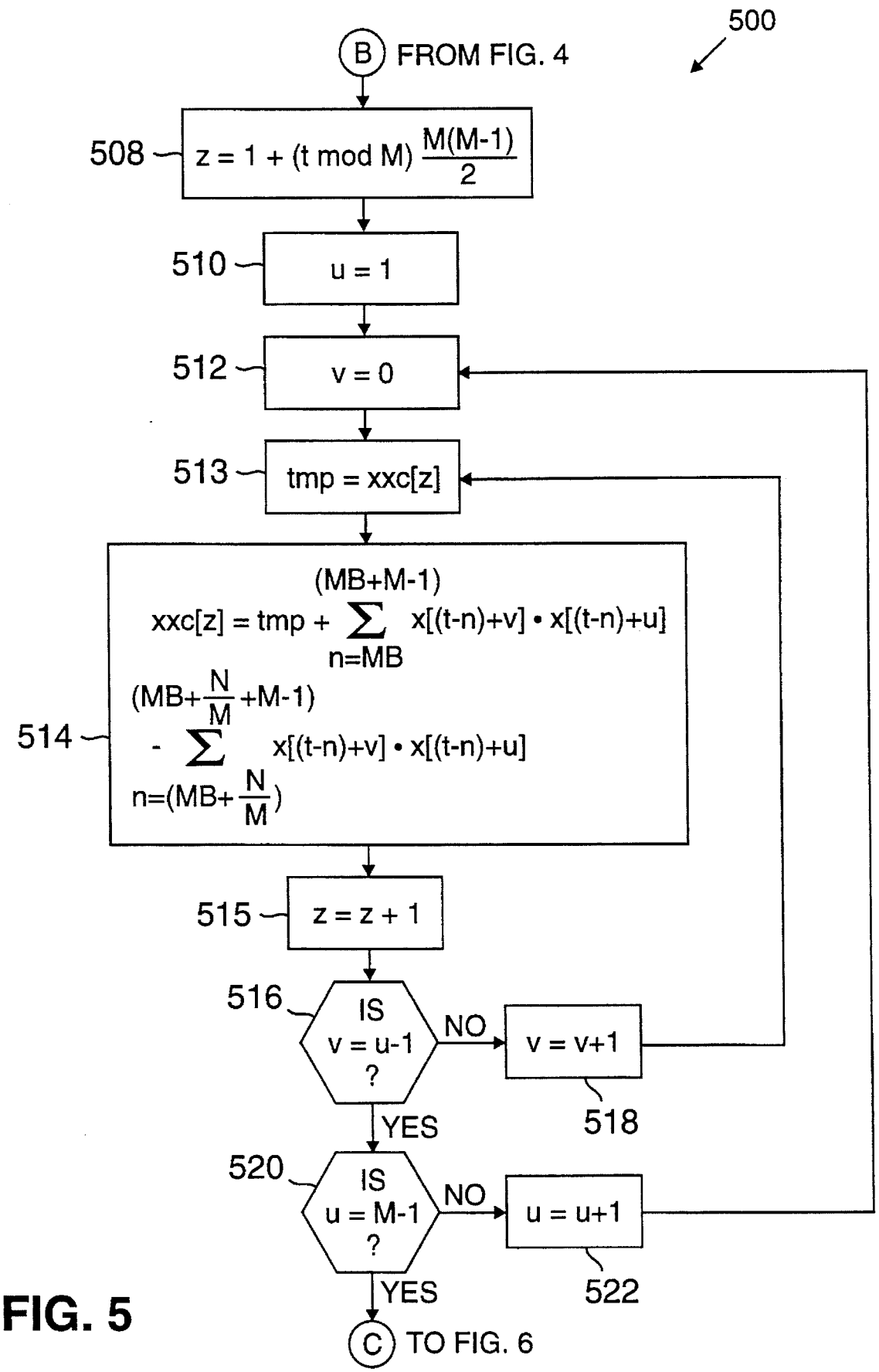

FIG. 5 illustrates steps of a process 500 that the processor 153A may perform to execute the operations associated with step 208 of the process 200. In the process 500, the processor 153A computes and stores in the memory 153B missed tap update xxc[ ] convolutions which are used to compensate for errors in calculating an echo signal estimate which may be caused because only a fraction of the tap values of H(t) are updated for each input signal sample. The use of the missed tap updates for calculating ŷ(t) is discussed below in connection with FIG. 6.

Referring to FIG. 5, in step 508, the processor 153A initializes the value stored in a counter z to the value 1+(t mod M) M (M−1)/2. Then in step 510, the processor 153A initializes the value stored in a counter u to the value of 1. In step 512, the processor 155A initializes a counter v to the value of 0. In step 513, the processor 153A retrieves the value xxc[z] stored in the memory 153B, and assigns it to a temporary variable tmp. Then, in step 514, the processor 153A calculates a new missed update convolution value xxc[z] for the current input signal sample from the following equation:

$$xxc[z] = tmp + \sum_{n=MB}^{MB+(M-1)} x[(t-n)+v] \cdot x[(t-n)+u] - \quad [8]$$

$$\sum_{n=(MB+\frac{N}{M})}^{(MB+\frac{N}{M} M - 1)} x[(t-n)+v] \cdot x[(t-n)+u]$$

The processor 153A further stores these calculated compensation values in the memory 153B as the variables xxc[z] for use in the ensuing determinations of echo signal estimates. In step 515, the processor 153A increments the value of z by one. Next, in step 516, the processor 153A determines whether the value stored in the counter v is equal to one less than the value stored in the counter u. If v≠u−1, then in step 518, the processor 153A increments the value stored in the counter v by one and then executes step 514. Otherwise, in step 520, the processor 153A determines whether the value stored in the counter u is equal to M−1. If u≠M−1, in step 522, the processor 153A increments by one the value stored in the counter u and then executes step 512. Otherwise, all M(M−1)/2 missed update convolution values xcc[ ] have been calculated and stored for the current input signal sample, and processing continues as explained in connection with FIG. 6.

Figure 6:
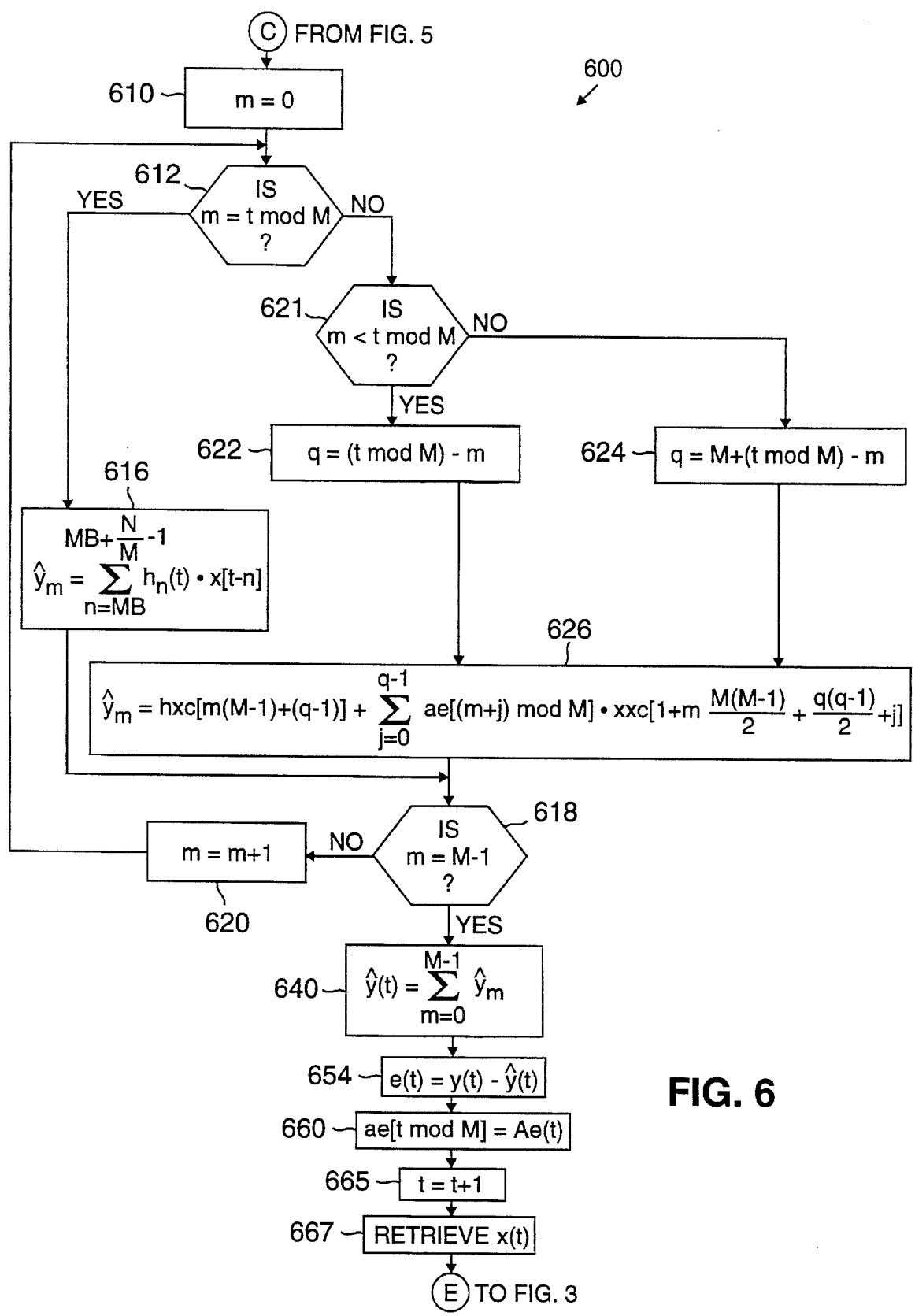

FIG. 6 concerns the operations that the processor 153A and the adder 157 may suitably perform to execute the steps 210, 214, 216, 217, 218 and 220 of the process 200 and compute the estimate echo signal for the current input signal sample. In the prior art, the estimate echo signal was typically determined by performing convolutions at every input signal sample for every tap, according to the conventional LMS update equation 1. The present invention, however, uses the equation 1 to determine only a part of the echo estimate signal. The remainder of the estimate echo signal is determined by the processor 153A using the previously calculated future hx[ ] convolution values, future xxc[ ] convolution values and past ae[ ] normalized error signal values which have been stored in the memory 153B.

Referring to FIG. 6, in step 610, the processor 153A initializes a counter m to a value of 0. The value stored in the counter m represents an index of partial estimate echo signals, ŷ$_m$, which are to be calculated in obtaining ŷ(t), as explained below. In step 612, the processor 153A determines whether m=(t mod M). If the condition is not true, step 621 is executed. If the condition is true, however, step 616 is executed. In step 616, a first partial estimate, ŷ$_m$, where m is equal to t mod M, is calculated from the tap values of the update subset block using the conventional LMS convolution equation, which is rewritten in terms of ŷ$_m$ as:

$$\hat{y}_m = \sum_{n=MB}^{MB + \frac{N}{M} - 1} h_n(t) \cdot x[t - n] \quad [9]$$

Step 618 is then executed.

In step 618, the processor 153A determines whether m=M−1, in other words, all the partial estimate echo signals, have been calculated. If so, step 640 is executed. If not, in step 620, the processor 153A increments the value stored in the counter m by one, and then executes step 612 once again. Step 618 is likewise executed after each of the other partial estimate echo signals is calculated, as discussed below.

If in step 612, m is not equal to t mod M, then step 621 is executed. In step 621, the processor 153A determines whether m<t mod M. If the condition in step 621 is true, then in step 622, the processor 153A sets the value stored in a counter q in the memory 153B equal to (t mod M)−m.

Otherwise, in step 624, the counter q is set equal to M+(t mod M)−m. After either step 622 or 624, step 626 is executed.

In step 626, the processor 153A calculates, based on values stored in the memory 153B, partial estimate echo signals using the stored values of previously calculated future hxc[ ] convolutions summed with previously calculated missed update convolution xxc[ ] values multiplied by previous normalized error signal values. The partial estimate signal equation is given by:

$$\hat{y}_m = hxc[m(M-1)+q-1] + \sum_{j=0}^{q-1} ae[(m+j) \bmod M] \cdot xxc\left[1 + m\frac{M(M-1)}{2} + \frac{q(q-1)}{2} + j\right] \quad [10]$$

The first term in equation [10] provides the component of the estimate echo signal response $\hat{y}(t)$ due to the hxc[ ] convolutions for the current sample of the set of taps that are not updated for the current input signal sample, in other words, hxc[ ] convolutions of all taps except the taps in the update subset block. The second term of equation [10] is a correction factor that compensates for the fact that only a fraction of the taps are updated at each sample.

After step 626, step 618 is again executed. If m≠m−1, step 620 is repeated and another partial estimate echo signal response is calculated. Once all the partial estimate echo signals are calculated for steps 616 and 626, step 640 is executed. In step 640, the processor 153A determines the echo estimate signal $\hat{y}(t)$ for the current input signal sample by summing all of the calculated partial estimate echo signal values. Then, in step 654, the adder 157 finds the difference between the signal y(t) and $\hat{y}(t)$ to determine an error signal e(t). The value of the error signal e(t), as a desired output of the adaptive FIR filter, is preferably equal to zero, such that echo signal is completely or partially cancelled by the estimate echo signal.

In step 660, the processor 153A calculates the normalized error signal ae(t) according to the standard LMS normalized error signal equation:

$$ae[t \bmod M] = Ae(t), \quad [11]$$

where A is a gain normalization term. Further in step 660, the processor 153A stores the value of the normalized error signal in the memory 153B as the variable ae[r], where r=t mod M. Thereafter, in step 665, the processor 153A increments the value of t by one, and in step 667, the next input signal sample is retrieved. The process for calculating the estimated echo signal for an input signal sample is then repeated, starting at step 308.

One reasonably skilled in the art can demonstrate that the embodiment of the present invention described above provides algebraically identical results, except for an M−1 sample delay, concerning the value of the estimated adaptive FIR filter response signal $\hat{y}(t)$ to that which would be obtained using the prior art LMS algorithm. The reason for the delay is that during the computation of the future hxc[ ] convolution in step 414, the term, x[(t+k)−n], in equation [6] requires future samples of x(t) for values of n in between 0 and M−1. In other words, the samples of x(t) required to compute the convolution in step 414 will not arrive until M−1 samples later. The M−1 sample delay period ensures that the required samples are available when needed in the computation.

In another embodiment of the present invention, estimate echo signals may be calculated without an M−1 sample delay. The flow diagram 200 described in connection with FIGS. 2B, 3, 4, 5 and 6 may be modified as follows to obtain estimate echo signal response without delay, which is particularly useful in the echo canceler embodiment of the FIR filter described above.

Referring to FIG. 2, the process 200 is modified by including a step 202 of updating the first M tap values $h_n(t)$, for n=0 to M−1, for every input signal sample provided to the echo canceler 150, as would be performed using a conventional LMS-based FIR filter. Furthermore, a step 203 for computing a partial estimate of the filter response for the first M taps based on the LMS estimate equation is added to the process 200 after step 202. Further, in steps 204, 316, 322, 414, 514 and 616 and the corresponding equations and descriptive text, the terms N/M must be changed to (N−M)/M. Also, in step 640 and the corresponding equation and descriptive text, the limit M−1 must be changed to M. It is to be understood, however, that other implementations such as, but not limited to, the rearrangement of the steps in FIGS. 3, 4, 5 and 6 will yield identical results.

Figure 7:
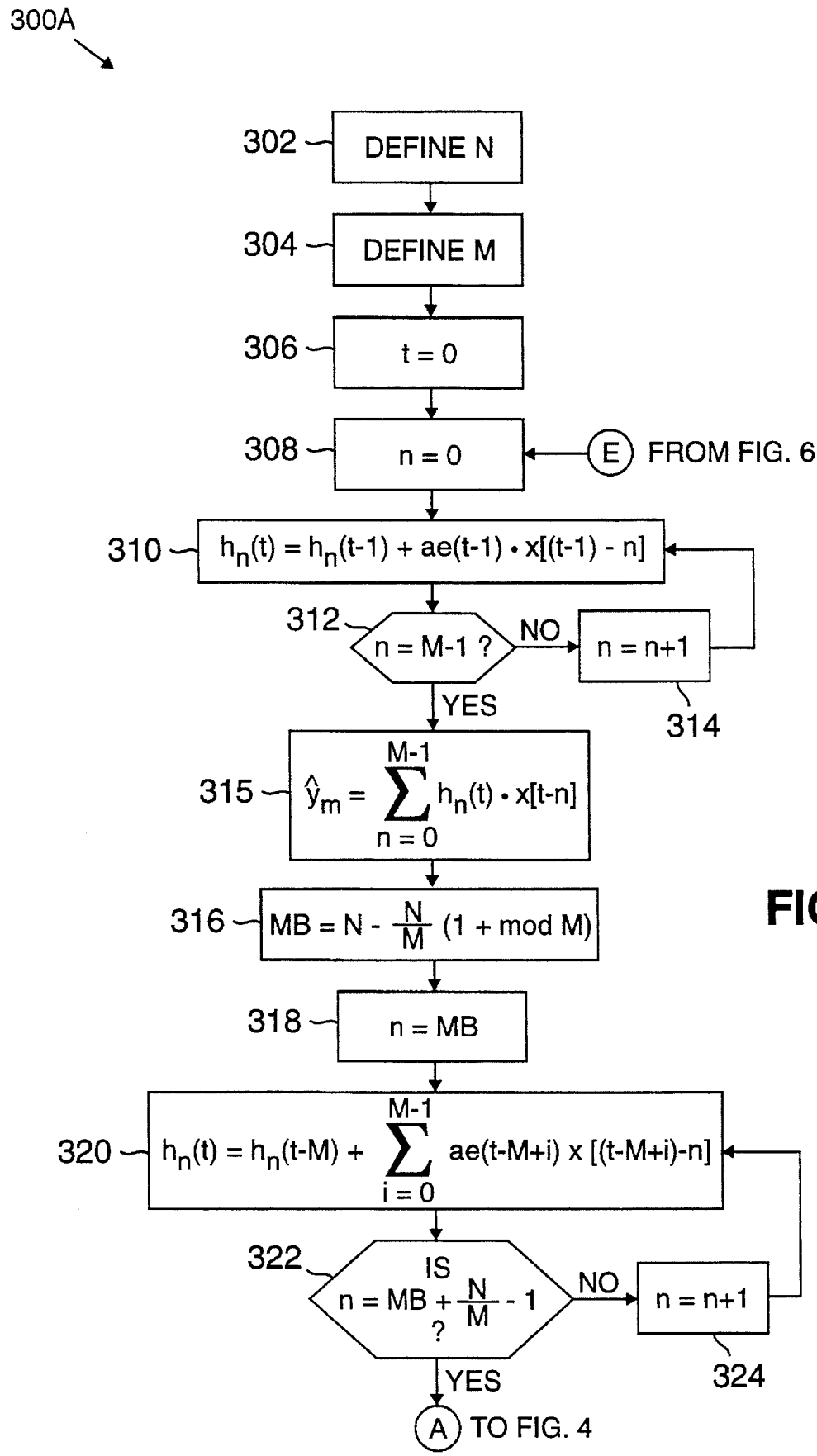
FIG. 7 illustrates a functional flow diagram of a method for performing the operation of an adaptive FIR filter to generate an estimate of a response signal without delay in accordance with the present invention.

FIG. 7 shows a process 300A which is similar to the process 300 of FIG. 3 and includes additional steps 310, 312, 314 and 315 for implementing the steps 202 and 203 described above. Alternatively, the step of computing the partial estimate signal response for the first M taps may be performed between steps 618 and 640 or included in step 616 of the process 600. In particular, the process 300A includes steps 302 through 308 and 316 through 324 which are performed in a similar, and preferably identical, manner as described above for the process 300. After step 308 is executed, in step 310, the processor 153A updates the nth tap for the time t in accordance with a conventional LMS update equation:

$$h_n(t) = h_n(t-1) + ae(t-1) \cdot x[(t-1)-n].$$

Thereafter, in step 312, the processor 153A determines whether n=M−1, in other words, whether the first M taps have been updated. If the first M taps have not been updated, then in step 314, the processor 153A increments n, and then step 310 is executed. Otherwise, step 315 is executed. In step 315, the processor 315A computes the portion of the filter response due to the first M taps by applying the conventional LMS estimate equation:

$$\hat{y}_M = \sum_{n=0}^{M-1} h_n(t) \cdot x[t-n]$$

to the first M taps.

One reasonably skilled in the art can demonstrate that this alternative embodiment of the present invention similarly provides algebraically identical results concerning the value of the estimated adaptive FIR filter response signal $\hat{y}(t)$ to that which would be obtained using the prior art LMS algorithm and known LMS design techniques and applications.

The present invention, thus, provides that a reduced number of memory accesses may be performed to calculate an estimate echo signal. Computation of an estimate of an echo signal using the present inventive technique provides for an approximate 1/M reduction in the number of memory accesses performed at the expense of only a small increase in the number of arithmetic operations that must be performed. Table 1 illustrates a comparison of the memory access requirements between the conventional prior art LMS technique and the embodiment of the present invention described above which provides an estimate response signal without delay, called the block LMS method for ease of reference.

TABLE 1

| | Memory Writes | | Memory Reads | |
| --- | --- | --- | --- | --- |
| Value | LMS | Block LMS | LMS | Block LMS |
| x(t) | 1 | 1 | N − 1 | N/M + 2M − 1 |
| H(t) | N | N/M + M − 1 | N | N/M + M − 1 |
| ae(t) | . | 1 | . | M |
| hxc[ ] | . | M − 1 | . | M − 1 |
| xxc[ ] | . | M(M − 1)/2 | . | M(M − 1) |
| Total | N + 1 | N/M + M(M − 1)/2 + 2M | 2N − 1 | 2N/M + M² + 4M − 3 |

Figure 8:
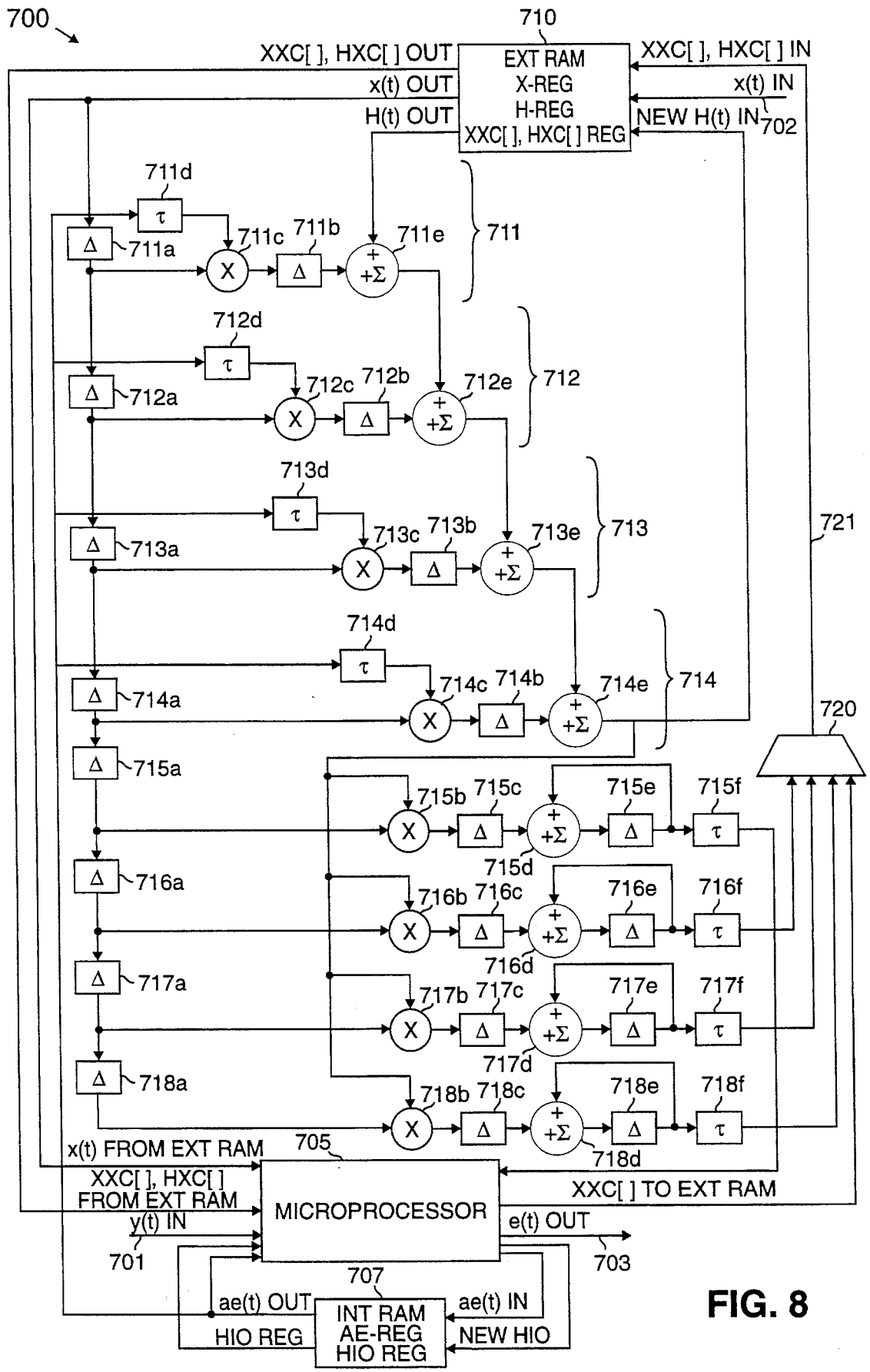
FIG. 8 illustrates a block diagram of an adaptive FIR filter configured as an echo canceler operable to perform the operations of the flow diagrams in FIGS. 2B, 4, 5, 6 and 7.

Although the majority of the operations illustrated in FIGS. 3, 4, 5, 6 and 7 may readily be performed by suitably preprogramming the processor 153A, it is sometimes advantageous to use a combination of discrete digital circuitry and a microprocessor to increase the operating speed of an FIR filter implementation of an echo canceler. FIG. 8 illustrates a preferred FIR filter 700 implementation of the echo canceler 150 employing four groups of taps H(t) operating according to the present invention, which includes both discrete digital circuitry as well as a microprocessor and provides an estimate of a response signal without delay. For purposes of illustration, the variables referred to above are utilized to describe the operations of the echo canceler 150 for the FIR filter 700 embodiment. In particular, it is assumed that N is equal to 512, m is equal to 4, 32 channels are being compensated and sampling of input signals x(t) is performed at 8 KHz. For purposes of clarity, certain timing and control devices are not included in FIG. 8, although their implementation will be readily apparent to those of ordinary skill in the art.

Referring to FIG. 8, the echo canceler 150 includes a microprocessor 705, an internal random access memory (RAM) 707, an external RAM 710, a plurality of tap update circuits 711 through 714, a plurality of hx convolution circuits 715 through 718 and a multiplexer 720.

The first tap update circuit 711 comprises two delay buffers 711a and 711b, a latch 711d, a dual input multiplier 711c and a dual input adder 711e. The first delay buffer 711a and the latch 711d are connected to the two inputs of the multiplier 711c. The second delay buffer 711b is connected between the multiplier 711c and the adder 711e. The remaining tap update circuits 712, 713 and 714 are constructed in a similar manner. Additional connections to portions of each tap update circuit are discussed further below.

The first hx convolution circuit 715 comprises three delay buffers 715a, 715c and 715e, a latch 715f, a dual input multiplier 715b and a dual input adder 715d. The first delay buffer 715a is connected to one input of the multiplier 715b. The second delay buffer 715c is connected between the output of the multiplier 715b and an input of the adder 715d. The third delay buffer 715e is connected at one end to the output of the adder 715d and at another end to the second input of the adder 715d and the latch 715f. The other hx convolution circuits 716, 717 and 718 are constructed in a similar manner.

The elements of the FIR filter 700 are interconnected as follows. The processor 705 includes a y(t) signal input 701 and an e(t) error signal output 703, and is connected to the internal RAM 707, the multiplexer 720 and the external RAM 710. The external RAM 710 additionally comprises an x(t) signal sample input 702, and is connected to an output 721 of the multiplexer 720. The external RAM 710 is further connected to an input of the adder 711e of the first tap update circuit 711, the adder 714e of the last tap update circuit 714 and the first convolution circuit delay buffer 711a.

Additionally, the tap update circuits 711 through 714 and the hx convolution circuits 715 through 718 are interconnected to each other as follows. The delay buffer 711a is connected to the delay buffer 712a, which in turn is connected to the delay buffer 713a, and so forth, through the delay buffer 718a. The output of the adder 711e is connected to one of the inputs of the adder 712e, the output of the adder 712e is connected to one of the inputs of the adder 713e and the output of the adder 713e is connected to one of the inputs of the adder 714e. The output of the adder 714e is connected to an input of each of the multipliers 715b, 716b, 717b and 718b. Each of the latches 715f, 716f, 717f and 718f are connected to the multiplexer 720. Each of the latches 711d, 712d, 713d and 714d are connected to the internal RAM 707. The latch 715f is connected to the processor 705.

Operation of the FIR filter embodied as the circuit 700 in the echo canceler 150 in accordance with the present invention may occur as follows. Each input signal sample, x(t), of a digitized speech input signal is provided to the external RAM 710 through the input 702. The RAM 710 then provides previously stored input signal samples to the processor 705 and the delay buffer 711a. As each input signal sample is provided to the delay buffer 711a, the delay buffer 711a provides the previous input signal sample to the next delay buffer 712a, as well as to the multiplier 711c. Thus, at any one time, the input signal sample x[t−n] is in the delay buffer 711a, x[t−n−1] is in the delay buffer 712a, and x[t−n−2] is in the delay buffer 713a, and so forth.

The processor 705 concurrently performs the conventional LMS update determination on the first M or 4 taps, or, in other words, executes steps 308 through 316 from FIG. 7. The update of the taps in the update subset block, as shown in steps 318 to 324, is then performed by the tap update circuits 711 through 714. For each tap $h_n(t)$, the RAM 710 provides the $h_n$(t−4) value to the first adder 711e. In addition, the proper normalized error signal values, as defined in step 320 of the process 300, are provided from the internal RAM 707 to the latches 711d through 714d. Then, each of the multipliers 711c through 714c perform the calculation called for in step 320, using the input signal sample values from the corresponding delay buffers 711a through 714a and the latches 711d through 714d. Then, the adders 711e through 714e sum the products of the multipliers 711c through 714c with the previous $h_n$(t−4) value provided at the adder 711e to yield the new $h_n(t)$ value.

The current and future hx convolutions, as shown in step 414 of FIG. 4 and step 616 of FIG. 6, are performed by the hx convolution circuits 715 through 718. The adder 714e provides the result of each new $h_n(t)$ which it generates to the external RAM 710 for storage, and to each of the multipliers 715b through 718b for use in calculating the current and future hx convolution values. At the same time, the four input signal sample values required for performing the convolutions are provided by the delay buffers 715a through 718a. The circuit 715 performs the hx convolution for the current input signal sample x(t) and sends the results to the microprocessor 705. Similarly, the circuits 716, 717 and 718 perform the future hx convolution for the future input signal samples x[t+1], x[t+2] and x[t+3].

The operations of an exemplary hx convolution determination by the circuit 715 is now described. As discussed above, $h_n(t)$ is provided to the multiplier 715b. Likewise, the delay buffer 715a provides the appropriate input signal sample, x[t−n], as defined in step 616, to the multiplier 715b. The multiplier 715b then provides the hx product to the delay buffer 715c, where it is temporarily held.

Next, the delay buffer 715e, which holds a running total or summation of the current input signal sample hx product values, provides the summation to the adder 715d. The new hx product in the delay buffer 715c is added to the running total in the adder 715d in accordance with step 616. The running total is further stored in the latch 715 when the computation is complete. The latch 715 provides the final hx convolutions total, which contain contributions from each tap in the block, to the microprocessor 705. In a similar manner, the circuits 716, 717 and 718 perform the future hx convolutions in accordance with step 414. The final computations are stored and held in the latches 716f, 717f and 717f, respectively, and are then suitably transmitted to the external RAM 710.

The microprocessor 705 performs the remainder of the steps illustrated in FIGS. 5 and 6. For example, the processor 705 determines the missed update compensation values, as discussed in connection with FIG. 5, by retrieving the appropriate input signal samples from the external RAM 710. In other words, the processor 705 executes steps 510 through 520, and the stored values required for performing step 514 are retrieved from the RAM 710. Likewise, the processor 705 calculates the estimate echo signal as discussed above in connection with FIG. 6.

It is to be understood that the embodiments and variations shown and described above are illustrative of the principles of this invention only and that various modifications may be implemented by those skilled in the art without departing from the scope and spirit of the invention.

We claim:

1. A method for generating estimates of response signals that a system produces from input signal samples which are introduced to the system, the method comprising the steps of:

providing the input signal samples and the response signals at first and second inputs, respectively, of an adaptive finite impulse response (FIR) filter, wherein the FIR filter includes N taps;

storing the plurality of input signal sample values and the plurality of response signal values in a memory;

grouping the FIR filter taps into M subset blocks, wherein each subset block comprises N/M taps;

updating periodically values of taps of the M subset blocks such that only a fraction of the taps are updated at each sample;

computing future convolution values for a first input signal sample from the values of the taps in an update subset block convolved with the values of the past input signals samples;

storing the future convolution values in the memory;

computing missed update compensation convolution values using values of the past input signal samples in order to compensate for not updating all taps at the current first input signal sample;

storing the missed update compensation convolution values in the memory;

computing a first partial estimate response signal value from a first partial convolution of the tap values of the update subset block with the values of the past input signal samples;

computing M−1 additional partial estimate response signal values based on previously stored values of future convolutions, missed update convolutions and normalized error signal values; and, summing the first and the M−1 additional partial estimate response signal values to yield a first estimate response signal for the first input signal sample.

2. The method of claim 1, further comprising the steps of:

computing the difference between the first estimate response signal value and a corresponding first response signal value; and, storing the difference in the memory as the error signal value associated with the first input signal sample.

3. The method of claim 1, wherein the FIR filter is included in an echo canceler of a communication network, and wherein the input signal samples are samples of speech signals provided over a channel of the network, the response signals are echo signals generated in the channel from the introduction of input signal samples to the network and the estimate response signals are estimate echo signals.

4. The method of claim 3, further comprising the step of:

computing the difference between the first echo estimate signal value and a corresponding first echo signal value in order to provide a resulting signal, such that echo is eliminated from the network.

5. A method for generating estimates of response signals which a system produces from input signal samples which are introduced to the system, the method comprising the steps of:

providing the input signal samples and the response signals at first and second inputs, respectively, of an adaptive finite impulse response (FIR) filter, wherein the FIR filter includes N taps;

storing the plurality of input signal sample values and the plurality of response signal values in a memory;

grouping the FIR filter taps into a first subset block and M second subset blocks, wherein the first subset block includes the first M taps and the remaining N-M taps are grouped in the M second subset blocks, wherein each of the M second subset blocks comprises (N-M)/M taps;

computing, for every input signal sample received, updated tap values for the first subset block;

updating periodically values of taps of the M second subset blocks such than only a fraction of the taps are updated at each sample;

computing future convolution values for a first input signal sample from the values of the taps in an update subset block convolved with the values of the past input signals samples;

storing the future convolution values in the memory;

computing missed update convolution values using values of the past input signal samples in order to compensate for not updating all taps at the current first input signal sample;

storing the missed update convolution values in the memory;

computing a first partial estimate response signal value from a first partial convolution of the tap values of the update subset block and the first subset block with the values of the past input signal samples;

computing M−1 additional partial estimate response signal values based on previously stored values of future convolutions, missed update compensation convolutions and normalized error signal values; and, summing the first and the M−1 additional partial estimate response signal values to yield a first estimate response signal for the first input signal sample.

6. The method of claim 5, further comprising the steps of:

computing the difference between the first estimate response signal value and a corresponding first response signal value; and, storing the difference in the memory as the error signal value associated with the first input signal sample.

7. The method of claim 5, wherein the FIR filter is included in an echo canceler of a communication network, and wherein the input signal samples are samples of speech signals provided over a channel of the network, the response signals are echo signals generated in the channel from the introduction of input signal samples to the network and the estimate response signals are estimate echo signals.

8. The method of claim 7, further comprising the step of:

computing the difference between the first echo estimate signal and a corresponding first echo signal value in order to provide a resulting signal, such that echo is eliminated from the network.

9. An apparatus for generating an estimate of response signals which a system produces from input signal samples which are introduced to the system, the apparatus comprising:

an adaptive finite impulse response (FIR) filter having first and second inputs for receiving the input signal samples and the response signals, respectively, wherein the FIR filter includes N taps;

a memory for storing the plurality of input signal sample values and the plurality of response signal values; and, a processor for performing the operations of:

grouping the FIR filter taps into M subset blocks, wherein each subset block comprises N/M taps, updating periodically values of taps of the M subset blocks such that only a fraction of the taps are updated at each sample;

computing future convolution values for a first input signal sample from the values of the taps in an update subset block convolved with the values of the past input signals samples, and computing missed update convolution values using values of the past input signal samples in order to compensate for not updating all taps at the current first input signal sample, wherein the processor stores in the memory the future convolution and the missed update convolution values, and wherein the processor performs the operations of:

computing a first partial estimate response signal value from a first partial convolution of the tap values of the update subset block with the values of the past input signal samples, computing M−1 additional partial estimate response signal values based on previously stored values of future convolutions, missed update compensation convolutions and normalized error signal values, and summing the first and the M−1 additional partial estimate response signal values to yield a first estimate response signal for the first input signal sample.

10. The apparatus of claim 9, wherein the processor further performs the operations of:

computing the difference between the first estimate response signal value and the stored first response signal value; and, storing the difference in the memory as the error signal value associated with that input signal sample.

11. The apparatus of claim 9, further comprising:

an adder including a negative input for receiving the first echo estimate signal value and a positive input for receiving a response signal from the system, wherein said adder sums the signals received at said positive and negative inputs and provides the result to the processor, and wherein the processor stores the result in the memory as the error signal value associated with the first input signal sample.

12. The apparatus of claim 9, wherein the FIR filter is included in an echo canceler of a communication network, and wherein the input signal samples are samples of speech signals provided over a channel of the network, the response signals are echo signals generated in the channel from the introduction of input signal samples to the network and the estimate response signals are estimate echo signals.

13. The apparatus of claim 12, wherein the processor further performs the operation of:

computing the difference between the first estimate response signal value and the corresponding first response signal value; and, storing the difference in the memory as the error signal value associated with the first input signal sample.

14. The apparatus of claim 13, further comprising:

an adder including a negative input for receiving the first echo estimate signal value and a positive input for receiving a response signal from the system, wherein said adder sums the signals received at said positive and negative inputs in order to provide a resulting signal, such that echo is eliminated from the network.

15. An apparatus for generating an estimate of response signals which a system produces from input signal samples which are introduced to the system, the apparatus comprising:

an adaptive finite impulse response (FIR) filter having first and second inputs for receiving the input signal samples and the response signals, respectively, wherein the FIR filter includes N taps;

a memory for storing the plurality of input signal sample values and the plurality of response signal values; and, a processor for performing the operations of:

grouping the FIR filter taps into a first subset block and M second subset blocks, wherein the first subset block includes the first M taps and the remaining N-M taps are grouped in the M second subset blocks, wherein each of the M second subset blocks comprises (N−M)/M taps, computing, for every input signal sample received, updated tap values for the first subset block, updating periodically values of taps of the M second subset blocks such than only a fraction of the taps are updated at each sample;

computing future convolution values for a first input signal sample from the values of the taps in an update subset block convolved with the values of the past input signals samples, computing missed update convolution values using values of the past input signal samples in order to compensate for not updating all taps at the current first input signal sample, wherein the processor stores in the memory the future convolution and the missed update convolution values, and wherein the processor performs the operations of:

computing a first partial estimate response signal value from a first partial convolution of the tap values of the update subset block and the first subset block with the values of the past input signal samples, computing M−1 additional partial estimate response signal values based on previously stored values of future convolutions, missed update compensation convolutions and normalized error signal values, and summing the first and the M−1 additional partial estimate response signal values to yield a first estimate response signal for the first input signal sample.

16. The apparatus of claim 15, further comprising:

an adder including a negative input for receiving the first estimate signal value and a positive input for receiving a response signal from the system, wherein said adder sums the signals received at said positive and negative inputs and provides the result to the processor, and wherein the processor stores the result in the memory as the error signal value associated with the first input signal sample.

17. The apparatus of claim 15, wherein the processor performs the operations of:

computing the difference between the first estimate response signal value and the corresponding first response signal value; and, storing the difference in the memory as the error signal value associated with the first input signal sample.

18. The apparatus of claim 15, wherein the FIR filter is included in an echo canceler of a communication network, and wherein the input signal samples are samples of speech signals provided over a channel of the network, the response signals are echo signals generated in the channel from the introduction of input signal samples to the network and the estimate response signals are estimate echo signals.

19. The apparatus of claim 18, wherein the processor performs the operation of:

computing the difference between the first estimate response signal value and the corresponding first response signal value; and, storing the difference in the memory as the error signal value associated with the first input signal sample.

20. The apparatus of claim 18, further comprising:

an adder including a negative input for receiving the first echo estimate signal value and a positive input for receiving a response signal from the system, wherein said adder sums the signals received at said positive and negative inputs in order to provide a resulting signal, such that echo is eliminated from the network.

21. A telecommunication system for eliminating echo signals in communication circuits within the system, the system comprising:

a first telephone unit operably connected to a long distance network;

a second telephone unit operably connected to the long distance network;

an echo canceler operably connected in a first circuit defined by the long distance network and the second telephone unit connection, wherein said echo canceler comprises an N tap adaptive FIR filter operable for:

receiving, at a first input, input signal samples of voice signals transmitted from the first telephone unit to the second telephone unit, receiving, at a second input, echo signals which are generated in the first circuit from the voice signals and transmitted back to the first telephone unit, storing the input signal sample values and the echo signal values in a memory, grouping the FIR filter taps into M subset blocks, wherein each subset block comprises N/M taps, updating periodically values of taps of the M subset blocks such that only a fraction of the taps are updated at each sample;

computing future convolution values for a first input signal sample from the values of the taps in an update subset block convolved with the values of the past input signals samples, storing the future convolution values in the memory, computing missed update compensation convolution values using values of the past input signal samples in order to compensate for not updating all taps at the current first input signal sample, storing the missed update compensation convolution values in the memory, computing a first partial estimate echo signal value from a first partial convolution of the tap values of the update subset block with the values of the past input signal samples, computing M−1 additional partial estimate echo signal values based on previously stored values of future convolutions, missed update convolutions and normalized error signal values, summing the first and the M−1 additional partial estimate response signal values to yield a first estimate echo signal for the first input signal sample, such that the first echo estimate signal value may be utilized for eliminating the corresponding first echo signal produced in the first circuit before transmission back to the first telephone unit.

22. The system of claim 21, further comprising:

an adder including a negative input for receiving the first echo estimate signal value and a positive input for receiving the first echo from the first circuit, wherein said adder sums the signals received at said positive and negative inputs and provides the result to the echo canceller for storage in the memory as the error signal value associated with the first input signal sample.

23. A telecommunication system for eliminating echo signals in communication circuits within the system, the system comprising:

a first telephone unit operably connected to a long distance network;

a second telephone unit operably connected to the long distance network;

an echo canceler operably connected in a first circuit defined by the long distance network and the second telephone unit connection, wherein said echo canceler comprises an N tap adaptive FIR filter operable for:

receiving, at a first input, input signal samples of voice signals transmitted from the first telephone unit to the second telephone unit, receiving, at a second input, echo signals which are generated in the first circuit from the voice signals and transmitted back to the first telephone unit, storing the input signal sample values and the echo signal values in a memory, grouping the FIR filter taps into a first subset block and M second subset blocks, wherein the first subset block includes the first M taps and the remaining N−M taps are grouped in the M second subset blocks, wherein each of the M second subset blocks comprises (N-M)/M taps, computing, for every input signal sample received, updated tap values for the first subset block, updating periodically values of taps of the M second subset blocks such than only a fraction of the taps are updated at each sample;

computing future convolution values for a first input signal sample from the values of the taps in an update subset block convolved with the values of the past input signals samples, storing the future convolution values in the memory, computing missed update convolution values using values of the past input signal samples in order to compensate for not updating all taps at the current first input signal sample, storing the missed update convolution values in the memory, computing a first partial estimate response signal value from a first partial convolution of the tap values of the update subset block and the first subset block with the values of the past input signal samples, computing a first partial estimate response signal value from a first partial convolution of the tap values of the update subset block and the first subset block with the values of the past input signal samples, computing M−1 additional partial estimate response signal values based on previously stored values of future convolutions, missed update compensation convolutions and normalized error signal values, summing the first and the M−1 additional partial estimate response signal values to yield a first estimate response signal for the first input signal sample, such that the first echo estimate signal value may be utilized for eliminating the corresponding first echo signal produced in the first circuit before transmission back to the first telephone unit.

24. The system of claim 23, further comprising:

an adder including a negative input for receiving the first echo estimate signal value and a positive input for receiving the first echo from the first circuit, wherein said adder sums the signals received at said positive and negative inputs and provides the result to the echo canceller for storage in the memory as the error signal value associated with the first input signal sample.

* * * * *